United States Patent
Furui et al.

(10) Patent No.: US 11,363,229 B1
(45) Date of Patent: Jun. 14, 2022

(54) ELECTRONIC DEVICE

(71) Applicant: InnoLux Corporation, Miao-Li County (TW)

(72) Inventors: Yuko Furui, Miao-Li County (TW); Akihiro Iwatsu, Miao-Li County (TW); Shuji Hagino, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/241,547

(22) Filed: Apr. 27, 2021

(51) Int. Cl.
*H04N 5/378* (2011.01)
*H04N 5/341* (2011.01)
*H03F 3/04* (2006.01)
*H04N 5/374* (2011.01)

(52) U.S. Cl.
CPC .............. *H04N 5/378* (2013.01); *H03F 3/04* (2013.01); *H04N 5/341* (2013.01); *H04N 5/3742* (2013.01)

(58) Field of Classification Search
CPC ...... H04N 5/341; H04N 5/3742; H04N 5/378; H03F 3/04
See application file for complete search history.

(56) References Cited

U.S. PATENT DOCUMENTS

| | | | |
|---|---|---|---|
| 6,784,928 B1* | 8/2004 | Sakurai | H04N 5/343 348/220.1 |
| 10,477,123 B2* | 11/2019 | Kaneko | H04N 5/374 |
| 2004/0085469 A1* | 5/2004 | Johnson | H04N 3/1568 348/308 |
| 2012/0307100 A1* | 12/2012 | Iwane | H04N 5/378 348/222.1 |
| 2013/0241022 A1 | 9/2013 | Oka | |

* cited by examiner

*Primary Examiner* — Lin Ye
*Assistant Examiner* — Chriss S Yoder, III
(74) *Attorney, Agent, or Firm* — McClure, Qualey & Rodack, LLP

(57) ABSTRACT

An electronic device is provided. The electronic device includes: a substrate, a plurality of pixels, a plurality of data lines, an amplifier and a current source. The pixels and data lines are disposed on the substrate. The amplifier and the current source are coupled to one of the data lines, wherein at least a portion of the one of data lines forms a conduction path. One of the pixels is coupled to the one of the data lines at a first node, and the first node is on the first conduction path. A first current that flows from the first node to the first source terminal is different from a second current that flows from the first node to the first output terminal.

18 Claims, 12 Drawing Sheets

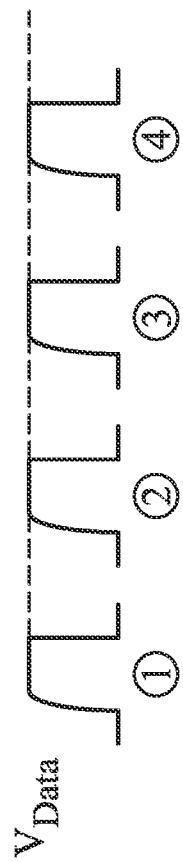
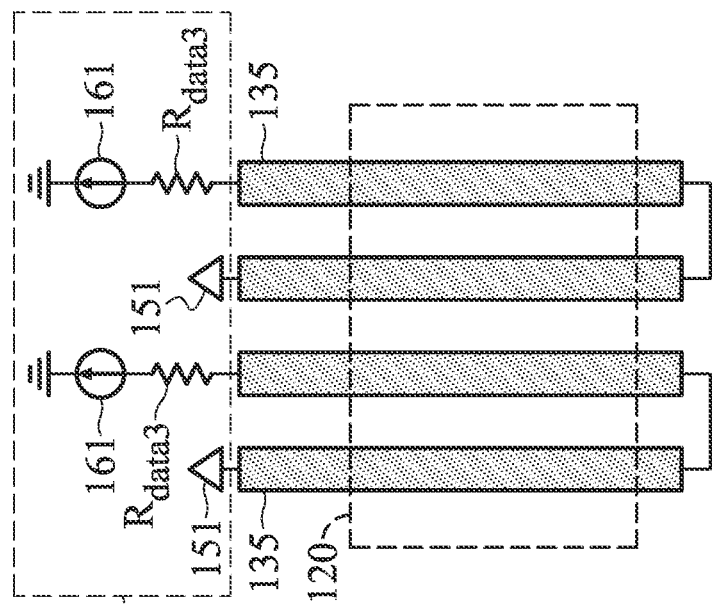
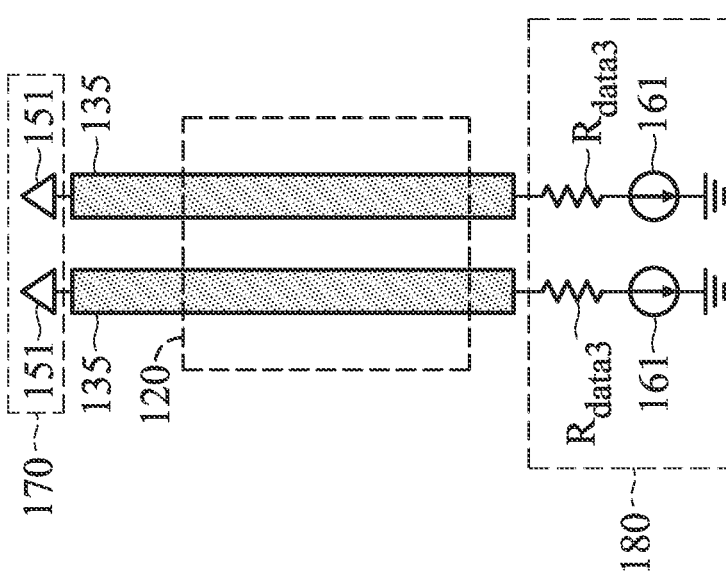

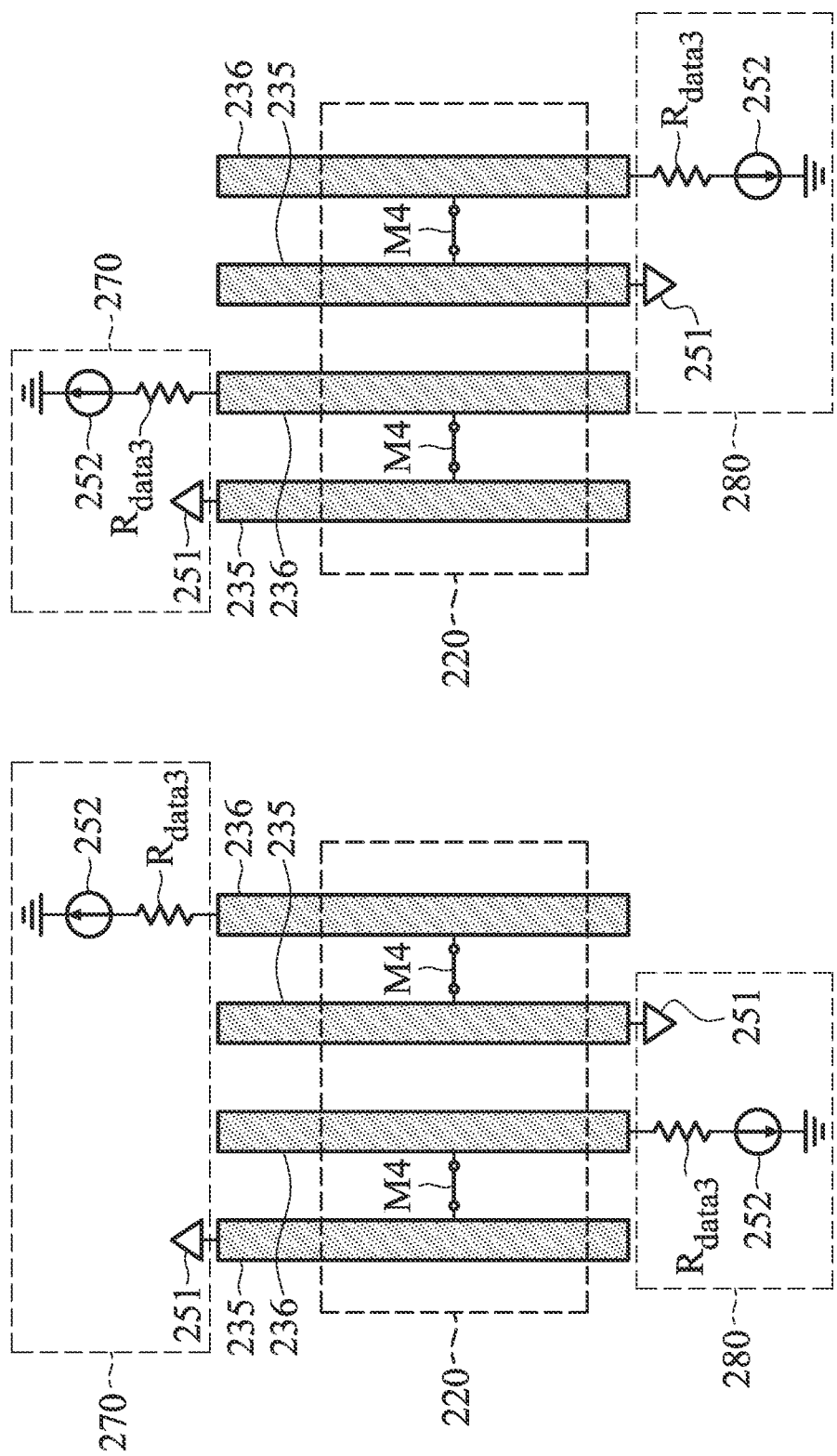

ELECTRONIC DEVICE

BACKGROUND OF THE DISCLOSURE

Field of the Disclosure

The present disclosure relates to electronic devices, and, in particular, to an electronic device with slighter IR-drop phenomenon.

Description of the Related Art

Currently, image sensors including active pixel sensors are widely used in electronic devices. In the image sensor, a plurality of pixels are coupled to a readout circuit, and the data from each pixel is read by the readout circuit. Generally, the readout circuit includes an amplifier and an adjoint current source. In addition, there is a resistance of the signal line between the output terminal of the pixel and the input terminal of the amplifier. As a result, the output data voltage of the pixel will suffer a serious voltage drop (IR-drop) at the input terminal of the amplifier.

Therefore, it would be desirable to provide an electronic device with slighter IR-drop phenomenon.

BRIEF SUMMARY OF THE DISCLOSURE

An electronic device is provided. The electronic device includes: a substrate, a plurality of pixels, a plurality of data lines, an amplifier and a current source. The pixels and data lines are disposed on the substrate. The amplifier and the current source are coupled to one of the data lines, wherein at least a portion of the one of data lines forms a conduction path. One of the pixels is coupled to the one of the data lines at a first node, and the first node is on the first conduction path. A first current that flows from the first node to the first source terminal is different from a second current that flows from the first node to the first output terminal.

Another embodiment of the present disclosure provides an electronic device. The electronic device includes: a substrate, a plurality of pixels, a plurality of data lines, a plurality of accompanying lines, an amplifier and a current source. The amplifier is coupled to one of the data lines, and the current source is coupled to one of accompanying the data lines. One of the pixels is coupled to the one of the data lines via a first node and is coupled to the one of the accompanying lines via the first node and a second node, and a first current that flows from the first node to the amplifier is different from a second current that flows from the first node to the current source.

BRIEF DESCRIPTION OF THE DRAWINGS

The present disclosure can be more fully understood by reading the subsequent detailed description and examples with references made to the accompanying drawings, wherein:

FIG. 1G is a schematic diagram of the output data voltage $V_{Data}$ of the pixel and the voltage at the input terminal of the amplifier in accordance with an embodiment of the disclosure;

FIGS. 1H-1K are partially schematic views of the electronic device in accordance with different embodiments of the disclosure;

FIGS. 2G-2J are partially schematic views of the electronic device in accordance with different embodiments of the disclosure.

DETAILED DESCRIPTION OF THE DISCLOSURE

Figure 1A:
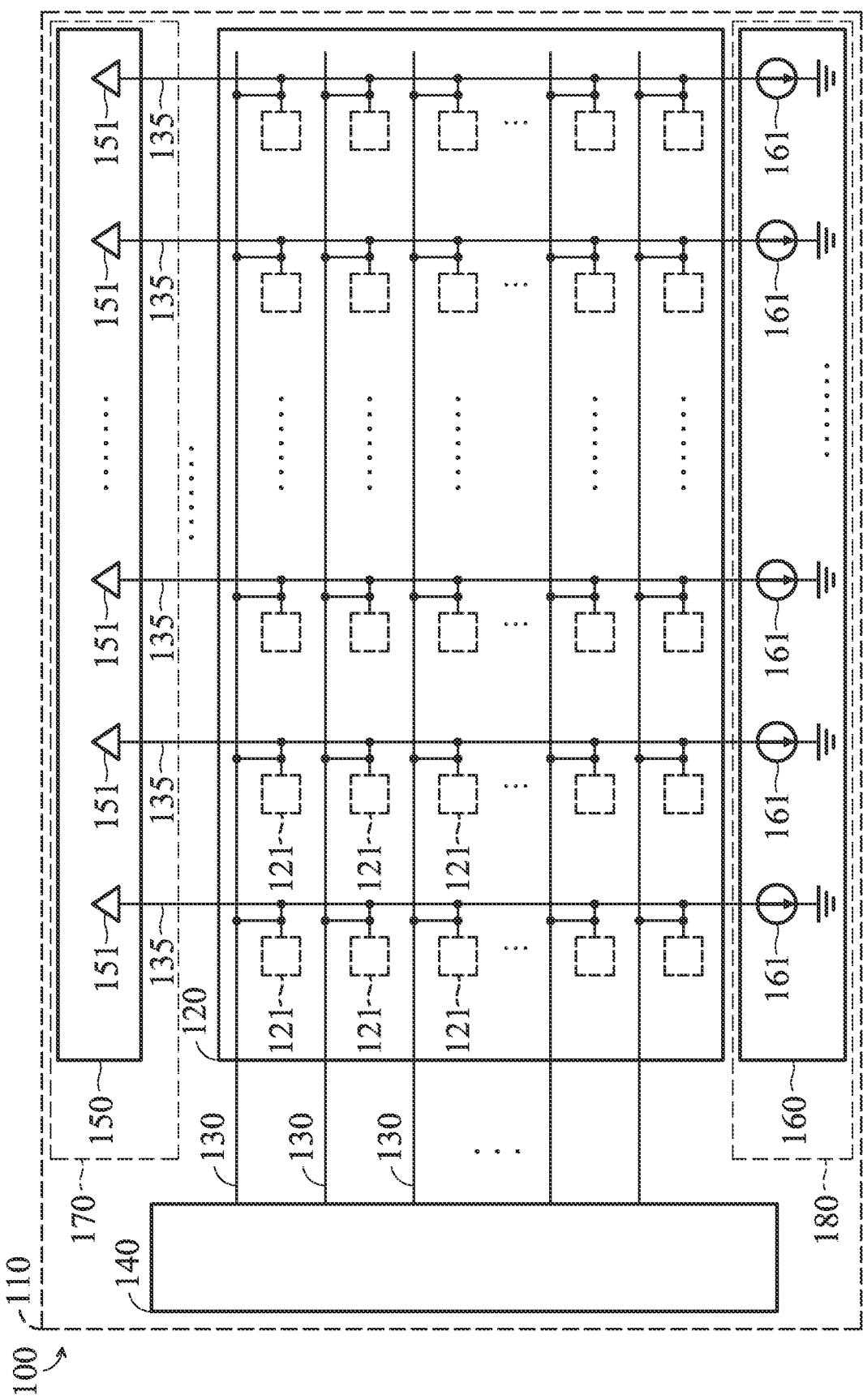
FIG. 1A is a diagram of an electronic device in accordance with an embodiment of the disclosure.

The following description is made for the purpose of illustrating the general principles of the disclosure and should not be taken in a limiting sense. The scope of the disclosure is determined by reference to the appended claims.

In the following detailed description, for purposes of explanation, numerous specific details and embodiments are set forth in order to provide a thorough understanding of the present disclosure. The use of like and/or corresponding numerals in the drawings of different embodiments does not suggest any correlation between different embodiments.

In addition, in this specification, relative spatial expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section in the specification could be termed a second element, component, region, layer, portion or section in the claims without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "approximately", "about" and "substantially" typically mean a value is within a range of +/−20% of the stated value, more typically a range of +/−10%, +/−5%, +/−3%, +/−2%, +/−1% or +/−0.5% of the stated value. The stated value of the present disclosure is an approximate value. Even there is no specific description, the stated value still includes the meaning of "approximately", "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

Figure 1B:
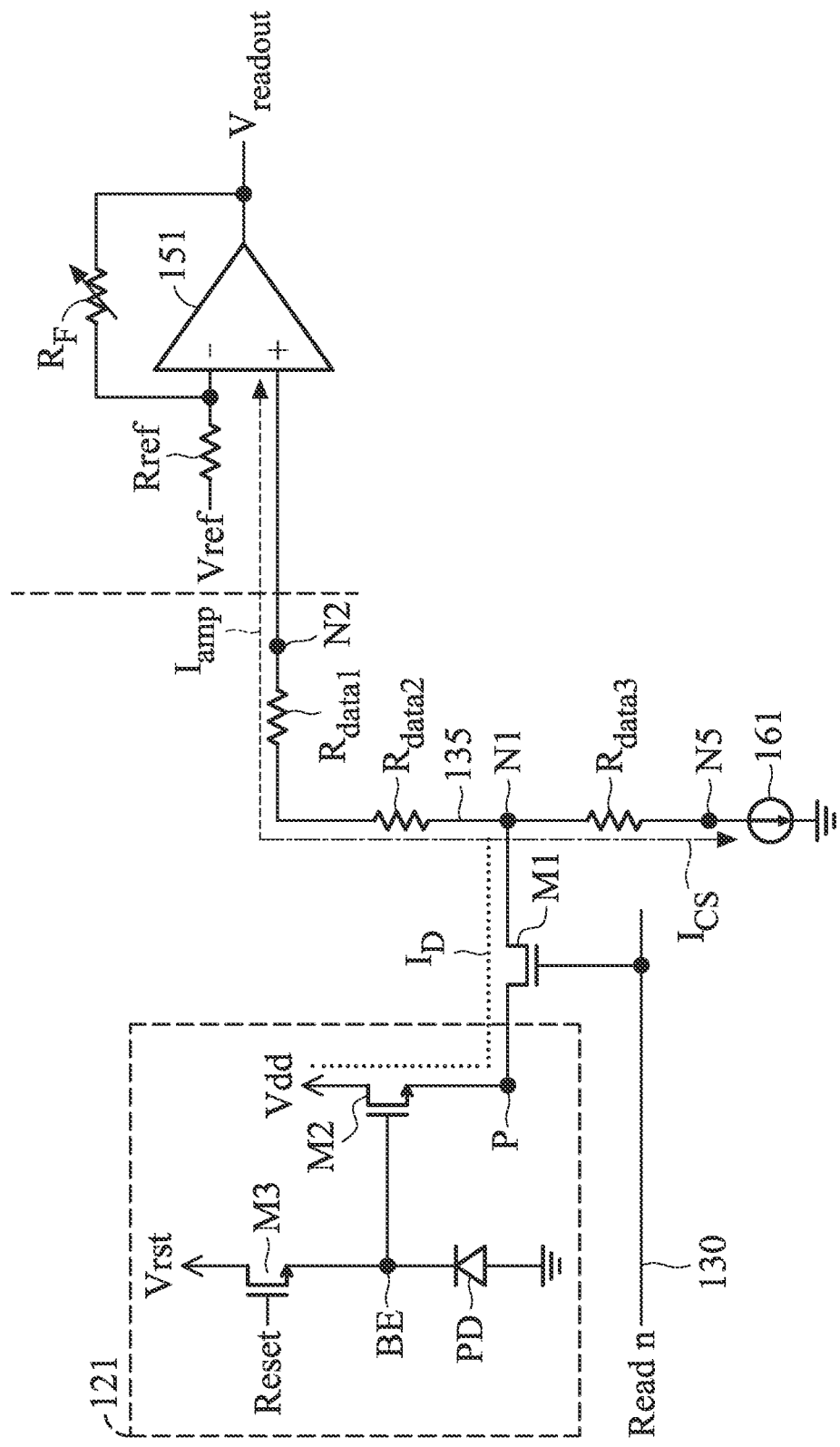
FIG. 1B is a schematic diagram of a pixel and its corresponding amplifier in accordance with the embodiment of FIG. 1A.

FIG. 1A is a diagram of an electronic device in accordance with an embodiment of the disclosure. FIG. 1B is a schematic diagram of a pixel and its corresponding amplifier in accordance with the embodiment of FIG. 1A.

In an embodiment, the electronic device 100 may include an image sensor. In some embodiments, the electronic device 100 may be a X-ray detector, fingerprint sensor, smart TV, smartphone, tablet PC, desktop computer, laptop computer, surveillance camera, digital camera, digital camcorder, etc., but the disclosure is not limited thereto.

The electronic device 100 may include a substrate 110, a pixel array 120, a plurality of read lines 130, a plurality of data lines 135, a driver circuit 140, a readout circuit 150, and a current-source section 160. The pixel array 120, the read lines 130, and the data lines 135 are disposed on the substrate 110. The pixel array 120 may be a two-dimensional array with X columns and Y rows of pixels 121 (X and Y are positive integers greater than 1). The readout circuit 150 and the current-source section 160 are respectively disposed in the edge regions 170 and/or 180, as shown in FIG. 1A. For convenience of description, the pixel 121 shown in FIG. 1B may include a 2T-APS (2-transistor-active-pixel sensor) circuit, but the disclosure is not limited thereto. It should be noted that the circuit in the pixel 121 can be implemented by any other known or newly developed circuit structure in the art.

There are Y read lines 130 and X data lines 135. The row-select signals transmitted by read lines 130 are respectively labeled from Read 1 to Read Y, and the data transmitted by the data lines 135 are labeled from Data 1 to Data X. The read lines 130 can be regarded as row-selection lines that are controlled by the driver circuit 140. For example, the driver circuit 140 will sequentially enable one read line 130 (i.e., one row), and the data in the pixels which are coupled to the enabled read line 130 can be read by the readout circuit 150 via the data lines 135.

Referring to FIG. 1B, the pixel 121 may include transistors M2 to M3, and a photodiode PD, but it is not limited thereto. The transistor M1 coupled between the pixel 121 and the data line 135 may be a row-select transistor that is controlled by the row-select signal Read n (n is an integer in a sequence from 1 to Y). The transistor M2 may be a source follower coupled to a voltage source Vdd, and the transistor M3 may be a reset transistor. When the reset signal Reset is in the low logic state and the row-select signal Read n is in the high logic state, the transistor M1 is turned on, and thus the data at node P is transmitted to node N1 on data line 135 via the transistor M1. The node N1 corresponding to the pixel 121 is located on a corresponding data line 135 and is coupled between the amplifier 151 and current source 161.

As shown in FIG. 1B, the current $I_D$ flows to node N1 via the transistors M2 and M1. At node N1, the current $I_D$ is split into two currents such as current $I_{amp}$ and current $I_{cs}$, where $I_{amp}$ denotes the current flowing into the amplifier 151 from node N1, and $I_{cs}$ denotes the current flowing toward the current source 161 from node N1. For example, given that the pixel 121 is coupled to the n-th read line 130 (i.e., the pixel 121 is in the n-th row), current $I_{amp}$ flows into the input terminal of the amplifier 151 via a resistance $R_{data2}$ and a resistance $R_{data1}$. It should be noted that the signal lines in the electronic device 100 respectively have their own resistances. If the length of a signal line increases, the resistance of the signal line may increase correspondingly. The resistance $R_{data1}$ may refer to an equivalent resistance between the input terminal of the amplifier 151 and the node N1 corresponding to the pixel 121 which is coupled to the first read line 130 (i.e., the pixel 121 is in the first row), the resistance $R_{data2}$ may refer to an equivalent resistance between the nodes N1 corresponding to the pixels 121 in two adjacent rows. In other words, there will be (N−1) resistances $R_{data2}$ when counting the resistance between the node N1 corresponding to the pixel 121 in the N-th row and the node N1 corresponding to the pixel 121 in the first row. To make it easy to understand, although the pixel 121 in FIG. 1B represents the pixel 121 in the n-th row, there is only one resistance $R_{data2}$ as a representation.

In addition, resistance $R_{data3}$ may refer to the resistance between the node N1 corresponding to the pixel 121 in the last row and the current source 161. Similarly, to make it easy to understand, although the pixel 121 in FIG. 1B represents the pixel 121 in the n-th row, there is no resistance $R_{data2}$ between the node N1 and the resistance $R_{data3}$.

In the present disclosure, since the input terminals of the amplifier 151 have a very high input impedance, and the current $I_{amp}$ flowing into the input terminals is very low, such as being approximately 20 pA (i.e., $2 \times 10^{-11}$ A). The current $I_{amp}$ is defined as the input bias current of the amplifier 151. The amplifier 151 may be in a non-inverting closed-loop configuration, as shown in FIG. 1B, where another input terminal of the amplifier 151 is coupled to a reference voltage Vref, but the present disclosure is not limited thereto.

In addition, the current source 161 may provide a more stable current $I_{cs}$ in a range of $10^{-6}$ A to $10^{-5}$ A ($10^{-6}$ A $\leq I_{cs} \leq 10^{-5}$ A). If the current $I_{cs}$ is 5 μA (i.e., $5 \times 10^{-6}$ A) and the current $I_{amp}$ is 20 pA (i.e., $2 \times 10^{-11}$ A), the ratio of current $I_{amp}$ to current $I_{cs}$ $$\left(\frac{I_{amp}}{I_{cs}}\right)$$

is 0.0004% (i.e., $4 \times 10^{-6}$). It should be noted that the ratio $$\frac{I_{amp}}{I_{cs}}$$

may vary due to different amplifiers 151. In some embodiments, the ratio may be equal to or less than $$0.0015\% \left(0 < \frac{I_{amp}}{I_{CS}} \leq 0.0015\%\right).$$

Therefore, in comparison with the current $I_{cs}$, the current $I_{amp}$ can be neglected. As a result, it can be derived that currents $I_D$ and $I_{cs}$ are substantially the same.

Specifically, in the present embodiment, node N1 may be the first place where the data voltage $V_{Data}$ enters the data line 135. At least a portion of the data line 135 between the amplifier 151 and the current source 161 forms a conduction path which may be the shortest path to make an electrical connection between the amplifier 151 and the current source 161. The node N1 is on the conduction path, and a current $I_{amp}$ from the node N1 to the amplifier 151 is smaller than a current $I_{cs}$ from the node N1 to the current source 161.

With respect to a portion of the conduction path from node N1 to the input terminal of the amplifier 151, since the current $I_{amp}$ is very small, the voltage V1 at node N1 and the voltage V2 at node N2 (i.e., the input terminal of the amplifier 151) are approximately the same.

With respect to another portion of the conduction path from node N1 to the current source 161, since the current $I_{cs}$ cannot be neglected, the voltage V1 at node N1 is greater than the voltage V5 at node N5 due to IR-drop phenomenon caused by the current $I_{cs}$ flowing via the resistance $R_{data3}$. The current source 161 is coupled between node N5 and the ground, and the ground has a ground voltage which is substantially equal to 0 or a predetermined reference voltage.

Figure 1C:
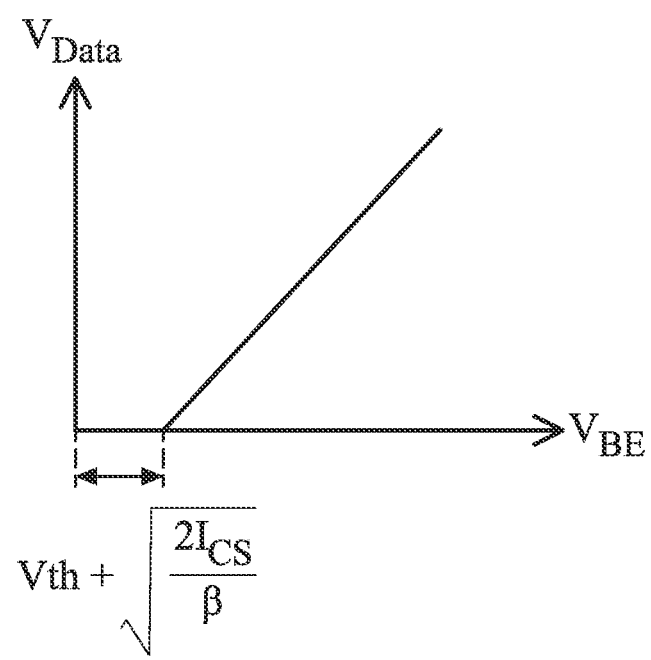
FIG. 1C is a diagram of the relationship between the between the voltages $V_{BE}$ and $V_{Data}$ in accordance with the embodiment of FIG. 1B.

Please refer to FIG. 1B. Specifically, when the row-select signal Read n is in the high logic state, the transistor M1 is turned on. Thus, the current $I_D$ flows via the drain and source of the transistor M2. Since $I_D \approx I_{CS}$, at this time, the data voltage $V_{Data}$ at the node N1 can be expressed by equation (1) and (2):

$$V_{Data} = V_{BE} - V_{th} - \sqrt{\frac{2I_{CS}}{\beta}} \quad (1)$$

$$V_{Data} = V_P = V_{BE} - V_{th} - \sqrt{\frac{2I_{CS} \cdot L}{W \cdot \mu \cdot C_{ox}}} \quad (2)$$

where $V_{BE}$ denotes the voltage at node BE; $V_P$ denotes the voltage at node P; Vth denotes the threshold voltage of the transistor M2; μ denotes the mobility of the transistor M2; W and L denote the width and length of the transistor M2, respectively; Cox denotes the capacitance per unit area of the transistor M2. At this time, the data voltage $V_{Data}$ at the node N1 depends on the voltage $V_{BE}$ and current $I_{CS}$, where the relationship between the voltages $V_{BE}$ and $V_{Data}$ is shown in FIG. 1C.

When the row-select signal Read n is in the low logic state, the transistor M1 is turned off. Thus, current $I_{CS}$ discharges the data voltage $V_{Data}$ towards the ground voltage.

Figure 1D:
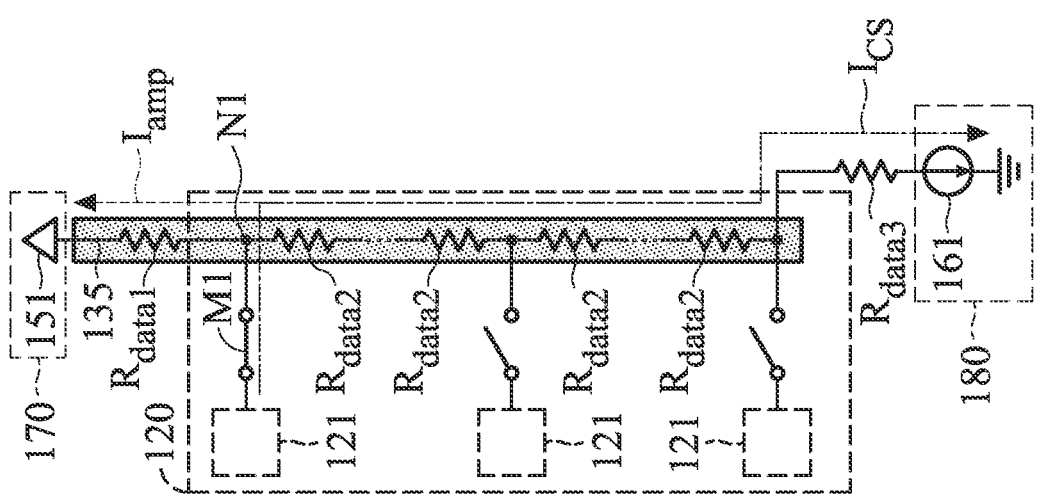
FIGS. 1D to 1F are partially schematic views of the electronic device in accordance with the embodiment of FIG. 1A.
Figure 1E:
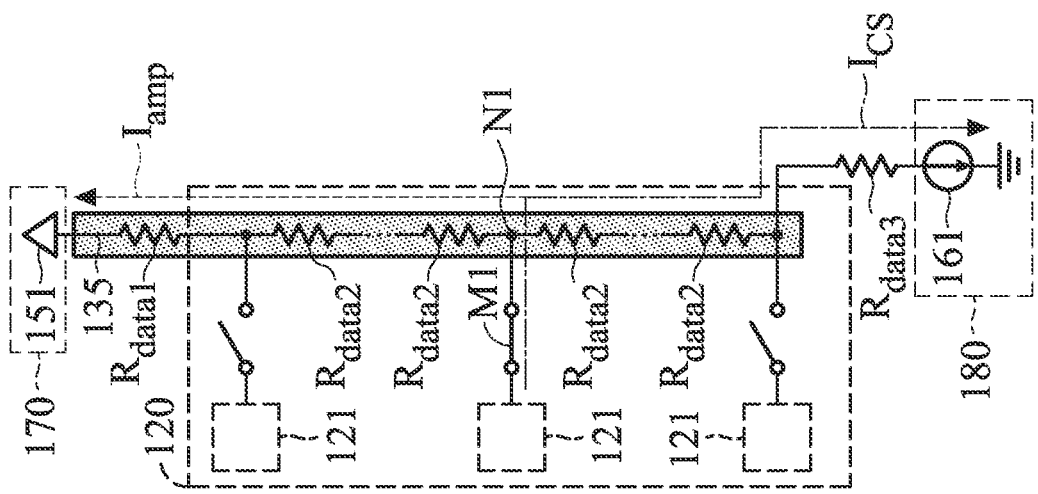
Figure 1F:
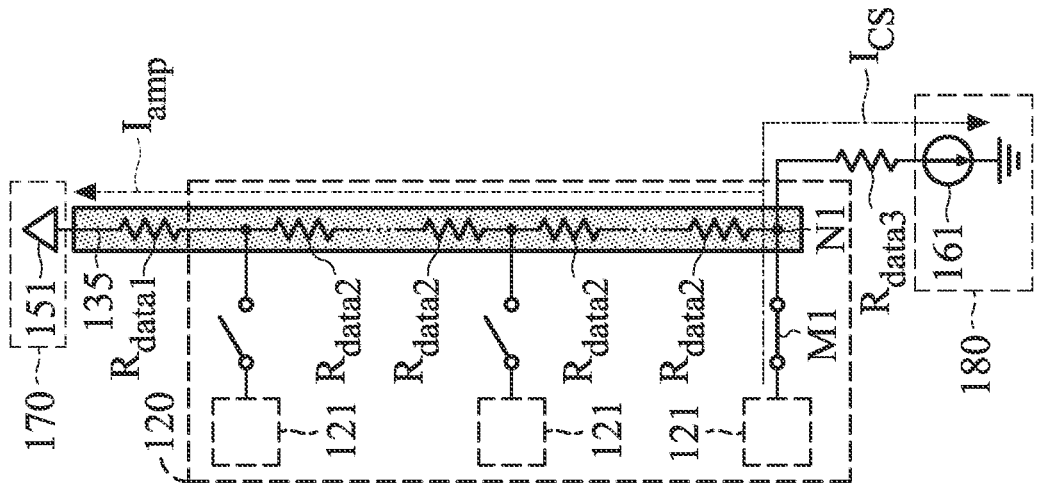

FIGS. 1D to 1F are partially schematic views of the electronic device in accordance with the embodiment of FIG. 1A. FIG. 1G is a schematic diagram of the output data voltage $V_{Data}$ of the pixel and the voltage at the input terminal of the amplifier in accordance with an embodiment of the present disclosure. Please refer to FIG. 1A and FIGS. 1D to 1G.

In the first scenario, referring to FIG. 1D, when row-select signal Read 1 is in the high logic state, the transistor M1 corresponding to the pixel 121 in the first row is turned on. Thus, the data voltage $V_{Data}$ of the pixel 121 in the first row is transmitted to the node N1 corresponding to the pixel 121 on the data line 135. For the pixel 121 in the first row, the current $I_{amp}$ flows into the amplifier 151 via the resistance $R_{data1}$. In addition, the current $I_{cs}$ flows into the current source 161 via (Y−1) resistances $R_{data2}$ and one resistance $R_{data3}$. If the waveform of the output data voltage $V_{Data}$ of the pixel 121 at node N1 is shown as the waveform at position ① in FIG. 1G, the waveform of the voltage at the input terminal of the amplifier 151 may be shown as the waveform at position ② in FIG. 1G. That is, since the current $I_{amp}$ flowing into the amplifier 151 is very small, the output data voltage $V_{Data}$ of the pixel 121 can be transferred to the amplifier 151 without serious voltage drop.

In the second scenario, referring to FIG. 1E, when the row-select signal Read n (n is a positive integer greater than 1 and less than Y) is in the high logic state, the transistor M1 corresponding to the pixel 121 in the n-th row is turned on. Only the data voltage $V_{Data}$ of the pixel 121 in the n-th row is transmitted to node N1 corresponding to the pixel 121 on the data line 135. Since the distance between node N1 and the input terminal of the amplifier 151 becomes longer, the current $I_{amp}$ flows into the amplifier 151 via (n−1) resistances $R_{data2}$ and the resistance $R_{data1}$. In addition, the current $I_{cs}$ flows into the current source 161 via the remaining resistances $R_{data2}$ and one resistance $R_{data3}$. It should be noted that since the current $I_{amp}$ is very small, the voltage drop caused by the current $I_{amp}$ is substantially negligible. If the waveform of the output data voltage $V_{Data}$ of the pixel 121 at node N1 is shown as the waveform at position ① in FIG. 1G, the waveform of the voltage at the input terminal of the amplifier 151 may be shown as the waveform at position ③ in FIG. 1G. Thus, the output data voltage $V_{Data}$ of the pixel 121 can be transferred to the amplifier 151 without serious voltage drop.

In the third scenario, referring to FIG. 1F, when row-select signal Read Y is in the high logic state, only the transistor M1 corresponding to the pixel 121 in row Y (i.e., the last row) is turned on. Thus, the data voltage $V_{Data}$ of the pixel 121 in row Y is transmitted to the node N1 corresponding to the pixel 121 on the data line 135. Since there are (Y−1) pixels between the amplifier 151 and the pixel 121 in the Y-th row, the current $I_{amp}$ flows into the amplifier 151 via (Y−1) resistances $R_{data2}$ and the resistance $R_{data1}$. In addition, there is no other pixel between the pixel 121 and the current source 161, and the current $I_{cs}$ from the pixel 121 flows into the current source 161 via one resistance $R_{data3}$. It should be noted that since the current $I_{amp}$ is very small, the voltage drop caused by the current $I_{amp}$ is negligible. If the waveform of the output data voltage $V_{Data}$ of the pixel 121 at node N1 is shown at position ① in FIG. 1G, the waveform of the voltage at the input terminal of the amplifier 151 may be shown at position ④ in FIG. 1G. That is, the output data voltage $V_{Data}$ of the pixel 121 can be transferred to the amplifier 151 without serious voltage drop.

FIGS. 1H-1K are partially schematic views of the electronic device in accordance with some embodiments of the disclosure.

As shown in FIG. 1A and in FIG. 1H, the amplifier 151 and the current source 161 coupled to the same data line are arranged at opposite ends of the data line (e.g., in opposite edge regions 170 and 180 of the substrate 110). For example, the amplifiers 151 coupled to adjacent data lines 135 can be disposed in the top edge region 170 of the substrate 110, and the current sources 161 coupled to the adjacent data lines 135 can be disposed in the bottom edge region 180 of the substrate 110.

In FIG. 1I, the amplifier 151 and the current source 161 coupled to the same data line are arranged in the same edge region 170 of the substrate 110. In addition, the data lines 135 may respectively have a U-shape, the readout switch (i.e., transistor M1 in FIG. 1B) corresponding to the pixel 121 is coupled to at least one of the U-shaped data lines.

Figure 1K:
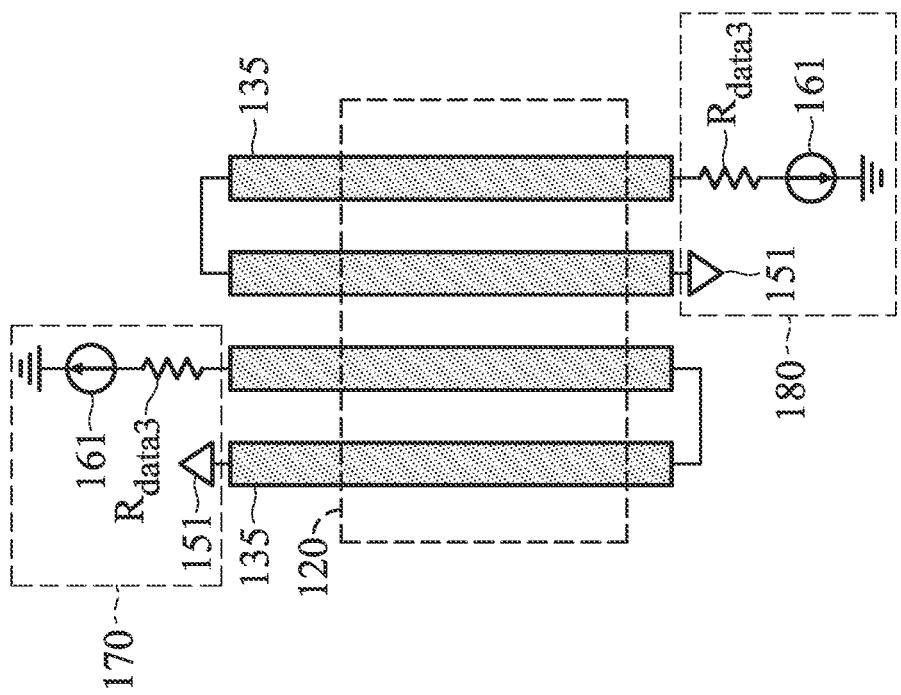
Figure 1J:
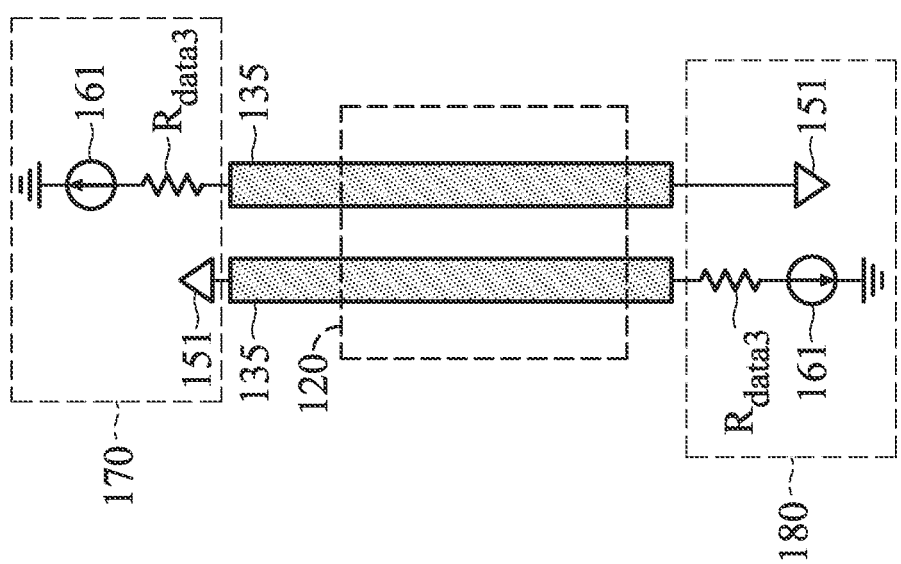

In FIG. 1J, the amplifier 151 and the current source 161 coupled to the same data line 135 are arranged at opposite ends of the data line (e.g., in opposite edge regions 170 and 180 of the substrate 110). However, the amplifier 151 and the current source 161 coupled to the adjacent data line 135 have a different arrangement. For example, for the left data line 135, the amplifier 151 is disposed in the top edge region 170 of the substrate 110, and the current source 161 is disposed in the bottom edge region 180 of the substrate 110. For the right data line 135, the amplifier 151 is disposed in the bottom edge region 180 of the substrate 110, and the current source 161 is disposed in the top edge region 170 of the substrate 110.

In FIG. 1K, the amplifier 151 and the current source 161 coupled to the same data line 135 are arranged in the same edge region 170 or 180 of the substrate 110. However, the amplifier 151 and the current source 161 coupled to the adjacent data line 135 have a different arrangement. In addition, the data line may have a U-shape, the readout switch (i.e., transistor M1 in FIG. 1B) of the pixel 121 is coupled to at least one of the U-shaped data lines 135. For example, for the left data line 135, the amplifier 151 and the current source 161 are disposed in the top edge region 170 of the substrate 110. For the right data line 135, the amplifier 151 and the current source 161 are disposed in the bottom edge region 180 of the substrate 110.

Figure 2A:
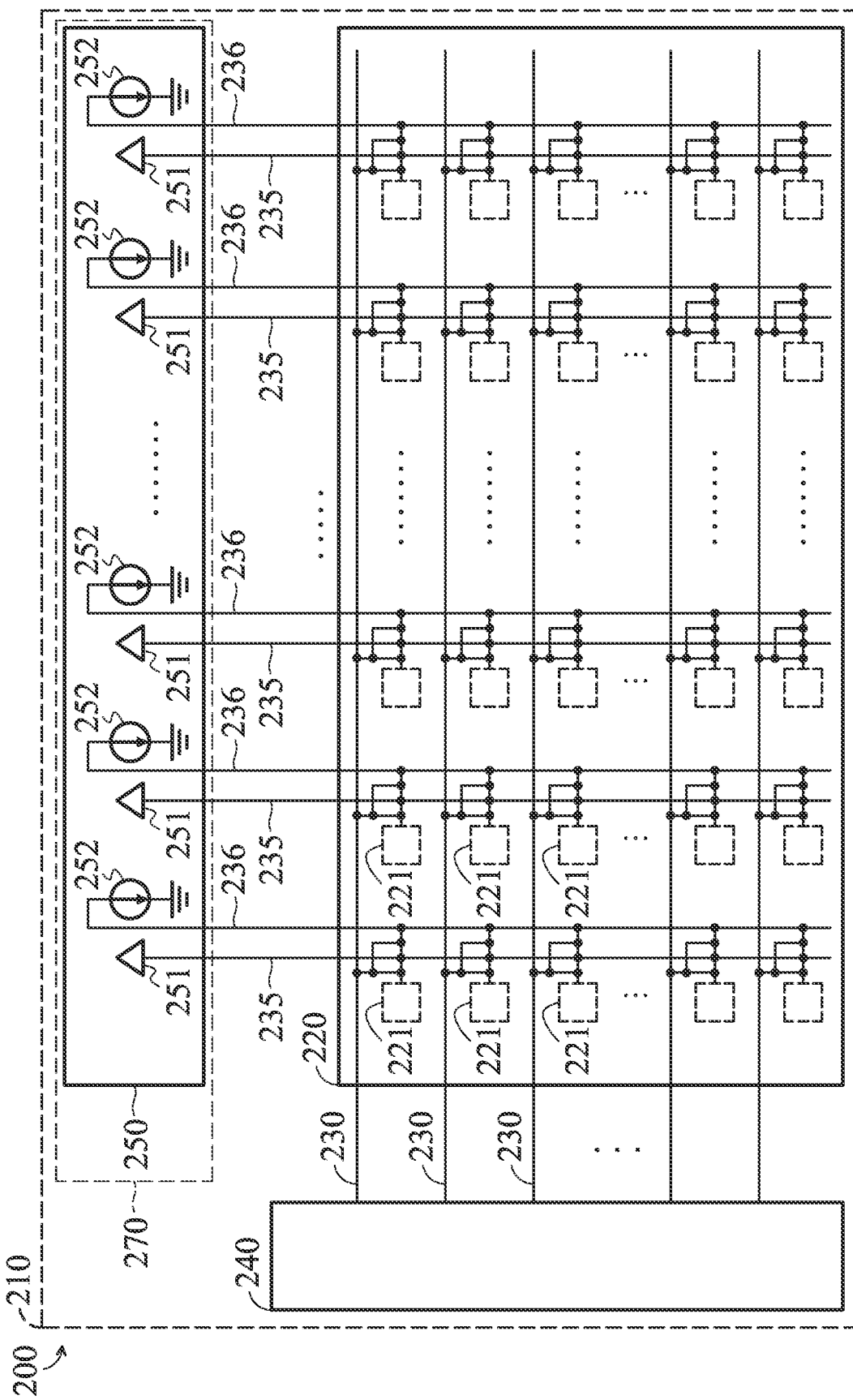
FIG. 2A is a diagram of the electronic device in accordance with another embodiment of the disclosure.

FIG. 2A is a diagram of the electronic device in accordance with another embodiment of the disclosure.

The electronic device 200 in FIG. 2A is similar to the electronic device 100 in FIG. 1A. The differences between the electronic device 200 and 100 may include: (1) an accompanying line 236 is adjacent to a data line 235; (2) another switch transistor is added to couple between a pixel 221 and the added accompanying line 236; and (3) the current source 252 is coupled to the accompanying line 236. Details for the aforementioned differences will be described in the following embodiments. It should be noted that the positions of the current source 252 and the amplifier 251 are not limited in the present embodiment. In some embodiments, the current source 252 may be changed to be coupled to the data line 235, and the amplifier 251 may be coupled to the accompanying line 236.

In an embodiment, a plurality of amplifiers 251 and a plurality of current sources 252 are disposed in the readout circuit 250, as shown in FIG. 2A. In addition, a current source 252 is coupled to the corresponding accompanying line 236. It should be noted that the arrangement of the amplifiers 251 and current sources 252 in FIG. 2A is for ease of description, and it is one of various arrangements of the disclosure, the other arrangements will be described in the following embodiments.

Figure 2B:
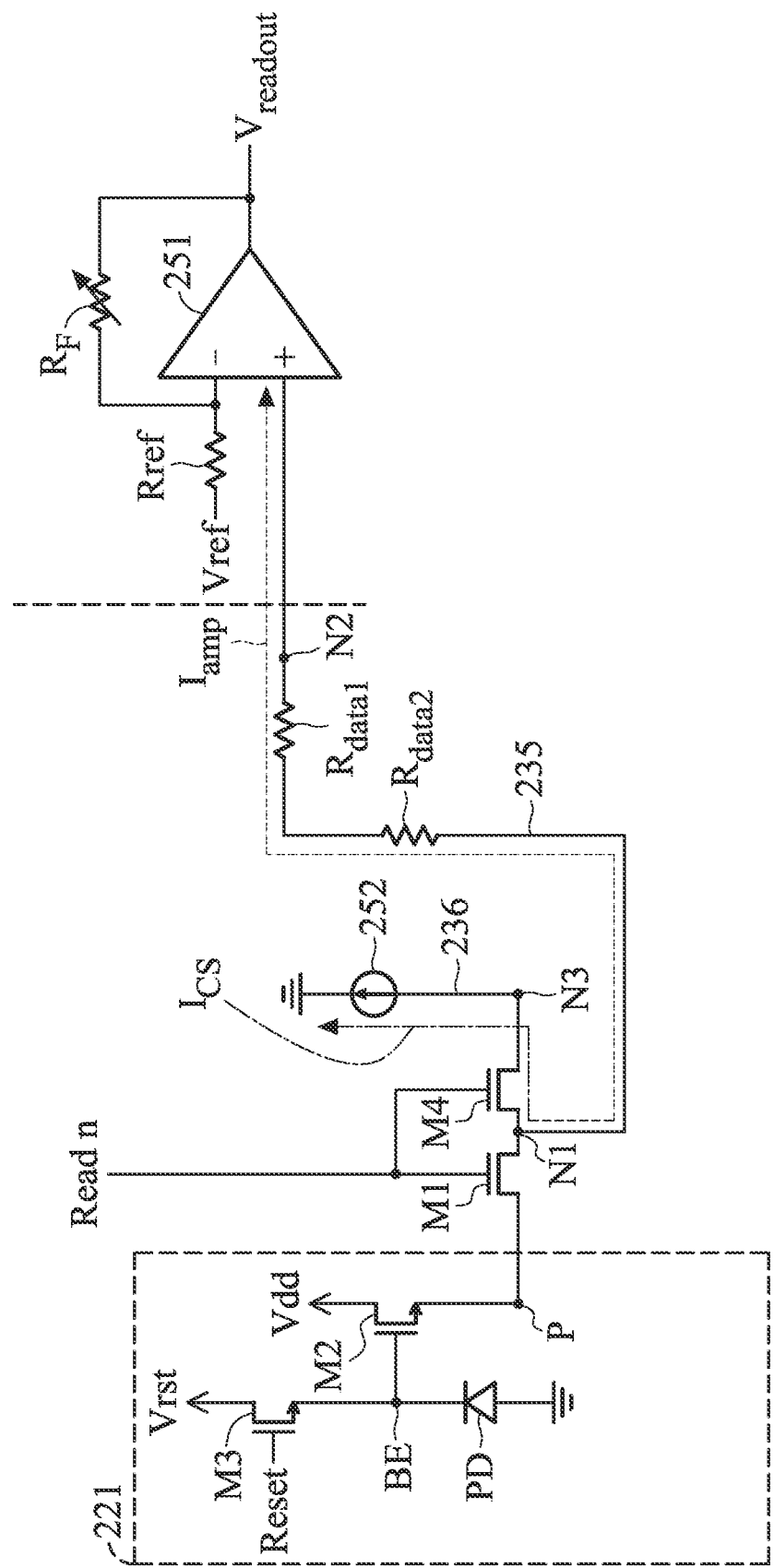
FIG. 2B is a schematic diagram of the pixel of a pixel and its corresponding amplifier in accordance with the embodiment of FIG. 2A.

FIG. 2B is a schematic diagram of a pixel and its corresponding amplifier in accordance with the embodiment of FIG. 2A.

FIG. 2A is similar to FIG. 1B. The difference is that there is an additional transistor M4, and it indicates that the pixel 221 can be implemented by a 2T-APS circuit, but the disclosure is not limited thereto. In FIG. 2B, the transistor M4 is a switch transistor that is coupled to transistor M1 at node N1, and the control terminal of transistor M4 may also be controlled by the same row-select signal Read n, but the disclosure is not limited thereto. In some embodiments, the transistor M1 and the transistor M4 are controlled by two different signals. To be more specific, the control terminal of transistor M1 may be controlled by the row-select signal Read n, and the control terminal of transistor M4 may be controlled by another control signal. It should be noted that in FIG. 2A, a pixel 221 may be coupled to its corresponding data line 235 via the transistor M1 and node N1, and coupled to its corresponding accompanying line 236 via two transistors M1 and M4 and two nodes N1 and N3. For example, if the row-select signal Read n is in the high logic state, transistors M1 and M4 are turned on, and the data at node P is transmitted to node N1 via transistor M1, and the data at node P is transmitted to node N3 via both transistors M1 and M4. Node N1 is coupled to the data line 235, and node N3 is coupled to the accompanying line 236.

Similar to the previous embodiment, in the present embodiment, node N1 may be the first place where the data voltage $V_{Data}$ enters the data line 235. A portion of the data line 235 between the amplifier 251 and node N1, a connection path between node N1 and node N3, and a portion of the accompanying line 236 between the current source 252 and node N3 form a conduction path which may be the shortest path to make an electrical connection between the amplifier 251 and the current source 252. The node N1 is on the conduction path, and a current $I_{amp}$ from the node N1 to the amplifier 251 is smaller than a current $I_{cs}$ from the node N1 to the current source 252.

Figures 2C, 2D, 2E:
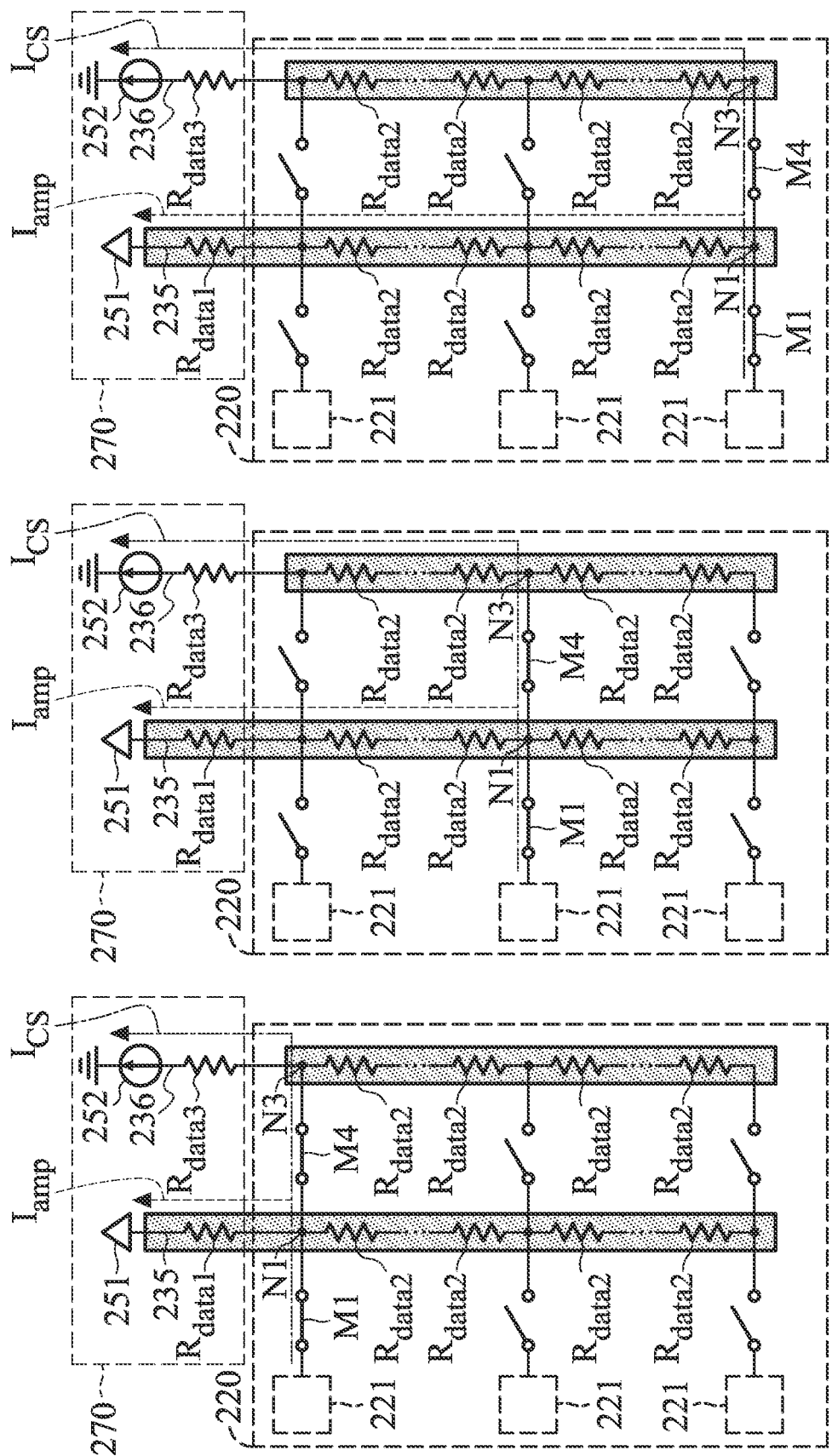
FIGS. 2C to 2E are partially schematic views of the electronic device in accordance with the embodiment in FIG. 2A.
Figure 2F:
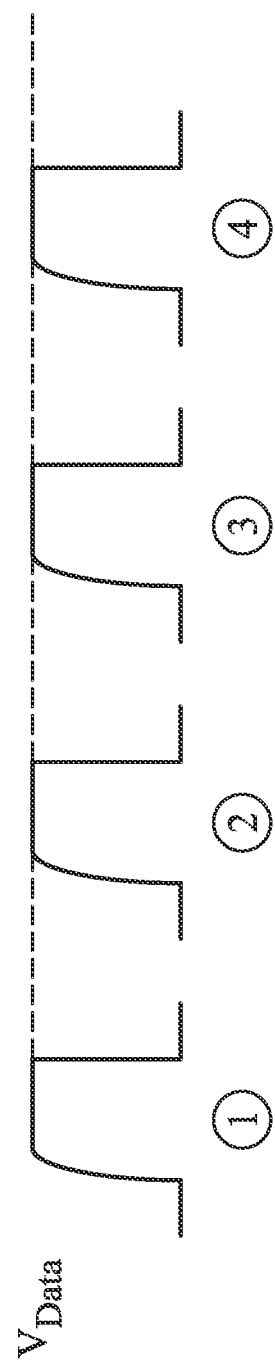
FIG. 2F is a diagram of the output data voltage $V_{Data}$ of the pixel and the voltage at the input terminal of the amplifier in accordance with an embodiment of the disclosure.

FIGS. 2C to 2E are partially schematic views of the electronic device in accordance with the embodiment in FIG. 2A. FIG. 2F is a diagram of the output data voltage $V_{Data}$ of the pixel and the voltage at the input terminal of the amplifier in accordance with an embodiment of the disclosure.

Please refer to FIGS. 2A to 2F. In the first scenario, referring to FIG. 2C, when the row-select signal Read 1 is in the high logic state, the transistors M1 and M4 corresponding to the pixel 221 in the first row are turned on. Thus, the data voltage $V_{Data}$ of the pixel 221 in the first row is transmitted to the node N1 which is on the data line 235, and is transmitted to the output node N3 which is on the accompanying line 236. Meanwhile, the pixels 221 in other rows are not coupled to the data line 235 and the accompanying line 236. Since there is no other pixel between the amplifier 251 and the pixel 221, the current $I_{amp}$ flows into the amplifier 251 via the resistance $R_{data1}$. In addition, the current $I_{cs}$ flows into the current source 252 via the resistance $R_{data3}$. As mentioned in the previous embodiment, the current $I_{amp}$ which flows into the amplifier 251 is much smaller than the current $I_{cs}$ which flows into the current source 252, and the voltage drop caused by the current $I_{amp}$ is negligible. If the waveform of the output data voltage $V_{Data}$ of the pixel 221 at node N1 is shown at position ① in FIG. 2F, the waveform of the voltage at the input terminal of the amplifier 251 may be shown at position ② in FIG. 2F. Thus, the output data voltage $V_{Data}$ of the pixel 221 can be transferred to the amplifier 251 without serious voltage drop.

In the second scenario, referring to FIG. 2D, when the row-select signal Read n (n is a positive integer lager than 1 and less than Y) is in the high logic state, the transistors M1 and M4 corresponding to the pixel 221 in the n-th row are turned on. Thus, the data voltage $V_{Data}$ of the pixel 221 in the n-th row is transmitted to node N1 which is on the data line 235, and is transmitted to node N3 which is on the accompanying line 236. Meanwhile, the pixels 221 in other rows are not coupled to the data line 235 and the accompanying line 236. Since there are (n−1) pixels between the amplifier 251 and the pixel 221 in the n-th row, the current $I_{amp}$ flows into the amplifier 251 via (n−1) resistances $R_{data2}$ and the resistance $R_{data1}$. In addition, the current $I_{cs}$ flows into the current source 252 via the (n−1) resistances $R_{data2}$ and one resistance $R_{data3}$. It should be noted that since the current $I_{amp}$ flowing into the amplifier 151 is very small, the voltage drop caused by the current $I_{amp}$ is negligible. If the waveform of the output data voltage $V_{Data}$ of the pixel 221 at node N1 is shown at position ① in FIG. 2F, the waveform of the voltage at the input terminal of the amplifier 251 may be shown at position ③ in FIG. 2F. Thus, the output data voltage $V_{Data}$ of the pixel 221 can be transferred to the amplifier 251 without serious voltage drop.

In the third scenario, referring to FIG. 2E, when the row-select signal Read Y is in the high logic state, the transistors M1 and M4 of the pixel 221 in the Y-th row (i.e., the last row) are turned on. Thus, the data voltage $V_{Data}$ of the pixel 221 in the Y-th row is transmitted to node N1 which is on the data line 235, and is transmitted to node N3 which is on the accompanying line 236. Meanwhile, the pixels 221 in other rows are not coupled to the data line 235 and the accompanying line 236. Since there are (Y−1) pixels between the amplifier 251 and the pixel 221 in the Y-th row, the current $I_{amp}$ flows into the amplifier 251 via (Y−1) resistances $R_{data2}$ and the resistance % taw. In addition, the current $I_{cs}$ from the pixel 221 flows into the current source 252 via (Y−1) resistances $R_{data2}$ and the resistance $R_{data3}$. It should be noted that since the current $I_{amp}$ flowing into the amplifier 151 is very small, the voltage drop caused by the current $I_{amp}$ is negligible. If the waveform of the output data voltage $V_{Data}$ of the pixel 221 at node N1 is shown at position ① in FIG. 2F, the waveform of the voltage at the input terminal of the amplifier 251 may be shown at position ④ in FIG. 2F. Thus, the output data voltage $V_{Data}$ of the pixel 221 can be transferred to the amplifier 251 without serious voltage drop.

FIGS. 2G to 2J are partially schematic views of the electronic device in accordance with different embodiments of the disclosure.

Figures 2G, 2H:
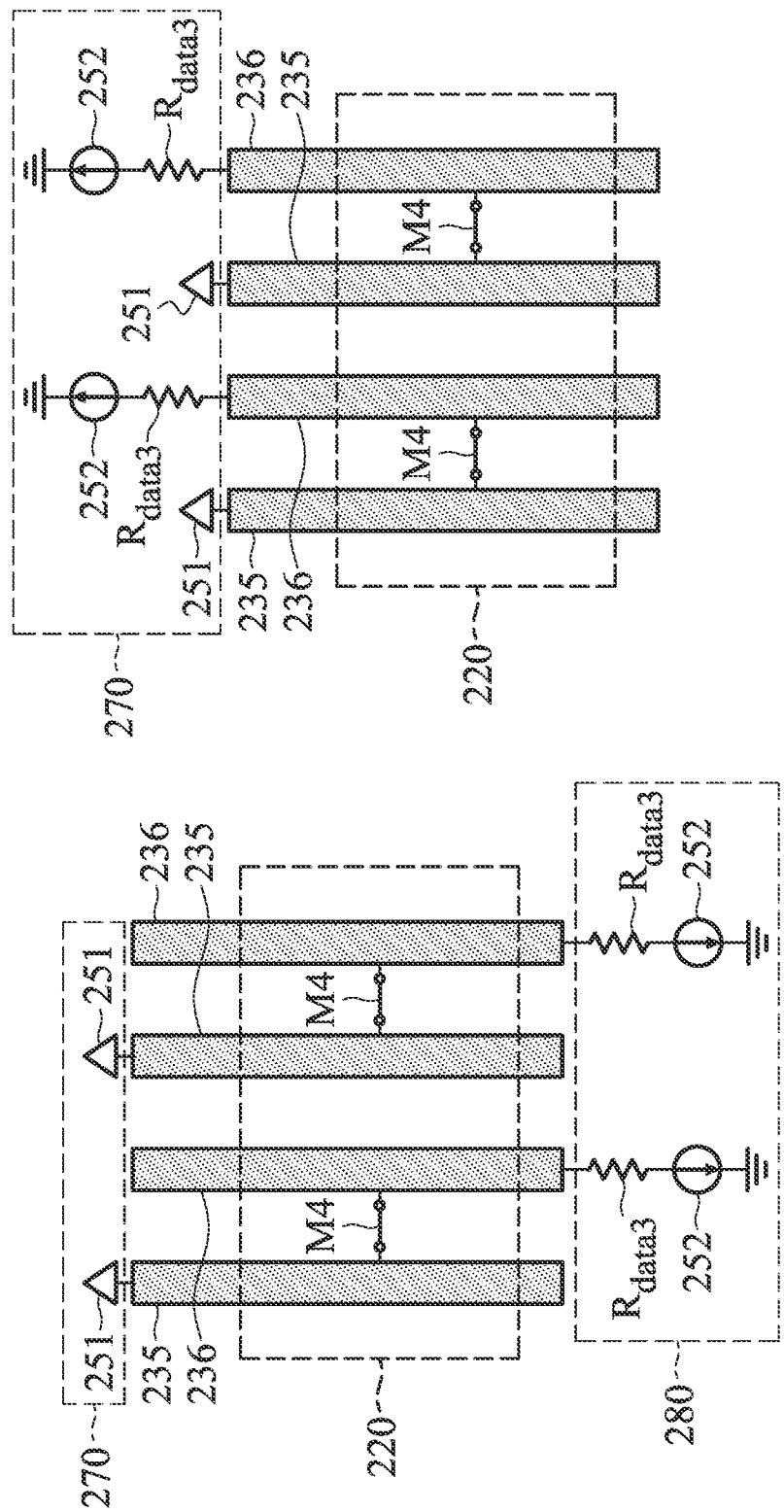

In FIG. 2G, the amplifiers 251 coupled to the data lines 235 and the current sources 252 coupled to the accompanying lines 236 are arranged in separate regions (e.g., in opposite edge regions 270 and 280 of the substrate 210). For example, the amplifiers 251 coupled to the left data line 235 and the right data line 235 can be disposed in the top edge region 270 of the substrate 210, and the current sources 252 coupled to the left accompanying lines 236 and the right accompanying lines 236 can be disposed in the bottom edge region 280 of the substrate.

In FIG. 2H, the amplifier 251 coupled to the data lines 235 and the current sources 252 coupled to the accompanying lines 236 are arranged in the same edge region 270 of the substrate 210. For example, the amplifiers 251 coupled to the left data line 235 and the right data line 235 can be disposed in the top edge region 270 of the substrate 210, and the current sources 252 coupled to the left accompanying line 236 and the right accompanying line 236 can be disposed in the top edge region 270 of the substrate, too. Alternatively, in some embodiments, the amplifiers 251 coupled to the data lines 235 and the current sources 252 coupled to the accompanying lines 236 can be disposed in a bottom edge region (not shown) of the substrate 210.

In FIG. 2I, the amplifier 251 coupled to one data line 235 and the current sources 252 coupled to one accompanying lines 236 are arranged separately (e.g., in opposite edge regions 270 and 280 of the substrate 210). However, the amplifier 251 coupled to the adjacent data line 235 and the current sources 252 coupled to the adjacent accompanying lines 236 may have a different arrangement. For example, for the left data line 235 and left accompanying lines 236, the amplifier 251 is disposed in the top edge region 270 of the substrate 210, and the current source 252 is disposed in the bottom edge region 280 of the substrate 210. For the right data line 235 and right accompanying lines 236, the amplifier 251 is disposed in the bottom edge region 280 of the substrate 210, and the current source 252 is disposed in the top edge region 270 of the substrate 210.

In FIG. 2J, the amplifier 251 coupled to one data line 235 and the current sources 252 coupled to the accompanying line 236 are arranged in the same edge region 270 of the substrate 210. However, the amplifier 251 coupled to the adjacent data line 235 and the current sources 252 coupled to the adjacent accompanying lines 236 may have a different arrangement. For example, for the left data line 235 and left accompanying lines 236, the amplifier 251 and the current source 252 are disposed in the top edge region 270 of the substrate 210. For the right data line 235 and right accompanying lines 236, the amplifier 251 and the current source 252 are disposed in the bottom edge region 280 of the substrate 210.

In view of the above, some embodiments of the present disclosure provide an electronic device, where the IR drop can be significantly reduced by branching the routes from the pixel to the amplifier and from the pixel to the current source. As a result, a very small current flows toward the input terminal of the amplifier, and thus the output data voltage of the pixel can be transferred to the amplifier without serious IR drop.

While the disclosure has been described by way of example and in terms of preferred embodiment, it is to be understood that those skilled in the art may make various combinations, changes, substitutions, and alterations to the disclosure without departing from the spirit and scope of the present disclosure. In addition, the scope of the present disclosure is not limited to the process, machines, manufacture, composition, devices, methods and steps in the specific embodiments described in the specification. Those skilled in the art will understand that existing or developing processes, machines, manufacture, composition, devices, methods, and steps may be performed in the aforementioned embodiments, as long as they can obtain substantially the same result, in accordance with some embodiments of the present disclosure. Therefore, the scope of the present disclosure includes the aforementioned processes, machines, manufacture, composition, devices, methods and steps. Furthermore, each of the appended claims constructs an individual embodiment, and the scope of the present disclosure also includes every combination of the appended claims and embodiments.

What is claimed is:

1. An electronic device, comprising:
   a substrate;
   a plurality of pixels disposed on the substrate;
   a plurality of data lines disposed on the substrate; and an amplifier and a current source coupled to one of the data lines, wherein at least a portion of the one of the data lines forms a conduction path;

wherein one of the pixels is coupled to the one of the data lines at a first node, the first node is on the conduction path, and a first current that flows from the first node to the amplifier is different from a second current that flows from the first node to the current source, wherein a ratio of the first current to the second current is equal to or less than 0.0015%.

2. The electronic device as claimed in claim 1, wherein the at least a portion of the one of the data lines is between the amplifier and the current source.

3. The electronic device as claimed in claim 1, wherein the substrate has a first edge region and a second edge region that are opposite to each other, and the amplifier and the current source are disposed in at least one of the first edge region and the second edge region.

4. The electronic device as claimed in claim 3, wherein the amplifier and the current source are disposed in different edge regions.

5. The electronic device as claimed in claim 1, further comprising another one of the data lines, another current source, and another amplifier, wherein the another current source and the another amplifier are coupled to the another one of the data lines.

6. The electronic device as claimed in claim 5, wherein an arrangement of the another current source and the another amplifier is different from an arrangement of the current source and the amplifier.

7. The electronic device as claimed in claim 1, wherein the one of the data lines has a U-shape.

8. The electronic device as claimed in claim 1, wherein the one of the pixels comprises a plurality of transistors and a photodiode.

9. The electronic device as claimed in claim 1, further comprising a plurality of read lines disposed on the substrate; and
a row-select transistor coupled between the one of the pixels and the one of the data lines, wherein a row-select signal is transmitted by one of the read lines, and the row-select transistor is controlled by the row-select signal.

10. An electronic device, comprising:
a substrate;
a plurality of pixels disposed on the substrate;
a plurality of data lines disposed on the substrate;
a plurality of accompanying lines disposed on the substrate;
an amplifier coupled to one of the data lines; and
a current source coupled to one of the accompanying lines,
wherein one of the pixels is coupled to the one of the data lines via a first node and is coupled to the one of the accompanying lines via the first node and a second node, and a first current that flows from the first node to the amplifier is different from a second current that flows from the first node to the current source, wherein a ratio of the first current to the second current is equal to or less than 0.0015%.

11. The electronic device as claimed in claim 10, wherein a portion of the one of the data lines between the amplifier and the first node, a connection path between the first node and the second node, and a portion of the one of the accompanying lines between the current source and the second node form a conduction path, and the first node is on the conduction path.

12. The electronic device as claimed in claim 10, further comprising:

a row-select transistor coupled between the one of the pixels and the one of the data lines, wherein the row-select transistor is controlled by a row-select signal; and a switch transistor coupled to the row-select transistor at the first node, wherein the switch transistor is controlled by the row-select signal.

13. The electronic device as claimed in claim 12, further comprising:

a plurality of read lines disposed on the substrate, wherein the row-select signal is transmitted by one of the read lines.

14. The electronic device as claimed in claim 10, further comprising:

a row-select transistor coupled between the one of the pixels and the one of the data lines; and a switch transistor coupled to the row-select transistor at the first node, wherein the row-select transistor and the switch transistor are controlled by two different signals.

15. The electronic device as claimed in claim 10, wherein the one of the pixels comprises a plurality of transistors and a photodiode.

16. The electronic device as claimed in claim 10, further comprising another one of the data lines, another one of the accompanying lines, another current source, and another amplifier, wherein the another amplifier is coupled to the another one of the data lines, and the another current source is coupled to the another one of the accompanying lines.

17. The electronic device as claimed in claim 10, wherein the substrate has a first edge region and a second edge region that are opposite to each other, and the amplifier and the current source are disposed in at least one of the first edge region and the second edge region.

18. The electronic device as claimed in claim 17, wherein the amplifier and the current source are disposed in different edge regions.

* * * * *